United States Patent
Ferrant et al.

(10) Patent No.: US 7,180,801 B2
(45) Date of Patent: Feb. 20, 2007

(54) MEMORY CIRCUIT WITH SHARED REDUNDANCY

(75) Inventors: Richard Ferrant, Esquibien (FR); François Jacquet, Froges (FR); Laurent Murillo, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/745,294

(22) Filed: Dec. 23, 2003

(65) Prior Publication Data

US 2005/0146952 A1 Jul. 7, 2005

Related U.S. Application Data

(63) Continuation of application No. 10/630,236, filed on Jul. 30, 2003, now abandoned, which is a continuation of application No. 10/328,712, filed on Dec. 23, 2002, now abandoned, which is a continuation of application No. 10/197,229, filed on Jul. 17, 2002, now abandoned, which is a continuation of application No. 10/010,744, filed on Dec. 7, 2001, now abandoned.

(30) Foreign Application Priority Data

Dec. 8, 2000 (FR) .................................. 00 16035

(51) Int. Cl.
*G11C 7/00* (2006.01)

(52) U.S. Cl. ............. 365/200; 365/230.03; 365/189.05
(58) Field of Classification Search ................. 365/200
See application file for complete search history.

(56) References Cited

U.S. PATENT DOCUMENTS

| | | | |
|---|---|---|---|
| 5,323,348 A | 6/1994 | Kinoshita et al. | |
| 5,506,807 A | 4/1996 | Ferrant et al. | |
| 5,999,450 A * | 12/1999 | Dallabora et al. | 365/185.09 |
| 6,151,263 A | 11/2000 | Kyung et al. | |
| 6,304,501 B2 * | 10/2001 | Ooishi | 365/200 |

OTHER PUBLICATIONS

French Search Report from French Patent Application No. 00 16035, filed Dec. 8, 2000.

* cited by examiner

*Primary Examiner*—Thong Q. Le
(74) *Attorney, Agent, or Firm*—Lisa K. Jorgenson; James H. Morris; Wolf, Greenfield & Sacks, P.C.

(57) ABSTRACT

An integrated circuit memory including at least two banks each provided with an array of storage elements having at least one redundancy column and each associated with specific sense amplifiers, a row of input/output buffer circuits common to the memory banks, and for each memory bank, a circuit for assigning the redundancy column to an input/output line connected to one of said buffers. The assigning can be performed, for a line of current rank, towards the columns of preceding rank and towards the columns of following rank.

25 Claims, 6 Drawing Sheets

MEMORY CIRCUIT WITH SHARED REDUNDANCY

This application is a continuation of prior application Ser. No. 10/630,236, filed Jul. 30, 2003 now abandoned which in turn is a continuation of prior application Ser. No. 10/328,712, filed Dec. 23, 2002 now abandoned which, in turn is a continuation of prior application Ser. No. 10/197,229, filed on Jul. 17, 2002 now abandoned which in turn is a continuation of prior application Ser. No. 10/010,744, filed on Dec. 7, 2001 now abandoned, entitled MEMORY CIRCUIT WITH SHARED REDUNDANCY.

BACKGROUND OF THE INVENTION

1. Field of the Invention

The present invention relates to memories formed in integrated circuits and provided with redundancy elements.

The present invention more specifically relates to integrated circuit memories formed of several arrays provided with amplifiers for reading the memory cells of each network and sharing common input/output circuits.

2. Discussion of the Related Art

The function of redundancy elements is to increase the manufacturing output of integrated circuit memories by functionally replacing a defective element with a redundancy element. An integrated circuit memory is generally made in the form of one of several arrays of cells for storing an information bit. The redundancy element generally is a row or a column of additional cells.

To simplify the present description, reference will be made, by an arbitrary convention, to a memory in which the redundancy element(s) are columns. However the present invention also applies to a memory in which the redundancy element(s) are rows.

FIG. 1 very schematically shows a conventional example of a memory circuit architecture to which the present invention applies.

In the example of FIG. 1, the memory is divided into p banks or arrays $B_l$, $B_k$, $B_{p-1}$, $B_p$ of memory cells, each including a row of sense amplifiers $SA_l$, $SA_{p-1}$, $SA_p$. Each memory cell bank includes a number of columns generally corresponding to number n of bits in a memory word, plus at least one redundancy column intended for replacing a column in which a defective element is present. In the example of FIG. 1, the rows of sense amplifiers are arranged between two half-banks of memory cells. This is an example and the present invention also applies to the case where the sense amplifier rows are arranged at the ends of the memory cell banks.

The amplifiers of the different banks are connected, per column, by means of input/output lines IOL intended for conveying the signals from the sense amplifiers to input/output elements 10 of the memory. These elements are generally called input/output buffers (I/O buffers) and are by a number n corresponding to the number of columns in the memory (with no redundancy column). To organize the redundancy, the input/output lines are interrupted between row 10 and first bank $B_l$ by a row 5 of switches or the like. Rank 5 includes means enabling, in the presence of a defective memory element in the column corresponding to a buffer, successively shifting the memory cell column used in relation with this input/output buffer and the following ones. In the left-hand portion of FIG. 1, the presence of a defect di has been assumed in a column i. The two outputs (direct and complementary) of the input/output buffer on the side of the memory cells of column i−1 are connected, by switching means 5, to line $IOL_{i-1}$. To simplify, reference is made to a line IOL although two conductors are actually involved. The outputs on the memory side of the input/output buffer associated with column i are however connected, by means 5, to line $IOL_{i+1}$. The shifting performed by circuit 5 continues until the last input/output buffer n, which is connected to line IOLn+1 corresponding to the redundancy column. Row 10 of input/output buffers includes n buffers while the memory cell arrays, as well as the sense amplifier rows, include n+1 columns.

In a memory architecture such as illustrated in FIG. 1, the redundancy is used not only to isolate a column of defective memory elements but also, given the interleaving of the sense amplifiers between the arrays, to isolate the amplifier from the defective column. This is a substantial improvement with respect to still prior redundancy systems where the sense amplifiers could not be repaired by redundancy elements.

The constraint of such a repair is to necessitate a disabling of the sense amplifiers of the defective column, for example, by cutting off their biasing. This is necessary since the most frequent problem of sense amplifiers is a short-circuit and that it is then necessary to turn off their power supply. Further, it is not known to isolate, by testing methods, whether the defect comes from an amplifier in the column or from a memory cell in this column.

To cut off the power supply of the amplifier of a defective column, a column conductor CTRL associated with each memory column is used, as illustrated by the right-hand portion of FIG. 1 detailing a column 12. This conductor is used to convey a signal for controlling the supply of the column amplifiers from row 5 of switch elements. Row 5 then integrates not only the elements necessary to organize the redundancy, but also to control the deactivation of the supply of an amplifier column.

In the forming of a memory circuit, the arrangement of the different components with respect to one another is linked to the necessary interconnections between these components to minimize the number of metallization levels of the integrated circuits. For example, and as illustrated in the right-hand portion of FIG. 1, the input/output lines ($IOL_i$), formed of a direct conductor IOLd and of a complementary conductor IOLc, are formed in the same metallization level as conductors CTRL for disabling the different amplifiers. The connections between the memory cells and the sense amplifiers (the bit lines not shown) are formed in an underlying metallization level with which conductors IOLd, IOLc, and CTRL communicate by vias v at the level of each amplifier of a column.

As appears from the discussion of FIG. 1, the existence of a defect in a memory array disables the use of the corresponding column in all the memory arrays sharing the input/output buffer.

Such a redundancy organization is well known and described, for example, in U.S. Pat. No. 5,506,807, which is incorporated herein by reference.

In the row direction, a memory further includes row-decoding elements associated with control elements. Physically, all these elements are, in the memory plane, generally gathered in a strip 15 located on one side of the arrays. Most often, an integrated memory circuit further includes column decoders (not shown) used to select a set of arrays illustrated in FIG. 1 by a succession of sets placed side by side.

A redundancy technique such as illustrated in FIG. 1 provides satisfactory results as long as the memory size remains relatively small. In practice, between 2 and 6 redundancy columns are provided. As a result, the number of columns likely to be repaired is limited in the same proportions. Now, the more the memory size increases, that is, the more the number of arrays sharing same input/output buffers increases, the higher the number of defects to be repaired statistically is. This thus poses the problem of having, either to unreasonably increase the number of redundancy columns, or to restrict the number of memory cell arrays sharing the same input/output buffers. Now, the input/output buffers are among the most bulky elements of an integrated circuit memory, and it is desirable to share them as much as possible.

SUMMARY OF THE INVENTION

The present invention aims at providing a novel memory circuit architecture having at least one redundancy column and which is particularly adapted to memories sharing a same row of input/output buffers between several arrays of memory cells, each having their own sense amplifiers.

The present invention more specifically aims at providing a redundancy solution which enables using a same redundancy column to replace defective cells located in different memory cell arrays.

A first solution would be to individualize the input/output buffers at the level of each memory cell array, that is, at the level of each sense amplifier row. However, a major disadvantage of such a solution is that it considerably increases the memory circuit size. This is the reason why it is most often desired to share a same row of input/output buffers between several arrays of memory cells, each having their own sense amplifier row.

The present invention thus aims at providing a solution which consumes less integrated circuit surface area.

The present invention further aims at providing a solution which requires no additional metallization level to organize the redundancy.

More specifically, the present invention provides an integrated circuit memory including:

at least two banks, each provided with an array of storage elements having at least one redundancy column and each associated with sense amplifiers which are specific to it;

a row of input/output buffer circuits common to the memory banks; and for each memory bank, a circuit for assigning the redundancy column to an input/output line connected to one of said buffers, the assigning being likely to be performed, for a line of current rank, towards the columns of preceding rank and towards the columns of following rank.

According to an embodiment of the present invention, each assignment circuit associated with a memory bank includes means for branching the input/output lines and conductors of individual activation of the sense amplifiers of the involved memory bank.

According to an embodiment of the present invention, said assignment circuits form switches for branching the input/output lines, all formed in a same metallization level.

According to an embodiment of the present invention, the input/output lines and the conductors of activation of the sense amplifiers are formed in a same metallization level, said lines and said conductors being interrupted level with each assignment circuit.

According to an embodiment of the present invention, the sense amplifiers are organized in rows perpendicular to the columns.

According to an embodiment of the present invention, the number of sense amplifiers per bank corresponds to the total number of columns of the arrays of storage elements, the number of input/output buffers corresponding to the number of columns of storage elements outside of the redundancy column.

According to an embodiment of the present invention, the assignment circuits are programmed by means of non-volatile memory registers.

According to an embodiment of the present invention, the memory includes means for individually addressing the different assignment circuits.

The foregoing objects, features and advantages of the present invention will be discussed in detail in the following non-limiting description of specific embodiments in connection with the accompanying drawings.

DETAILED DESCRIPTION

Figure 1:
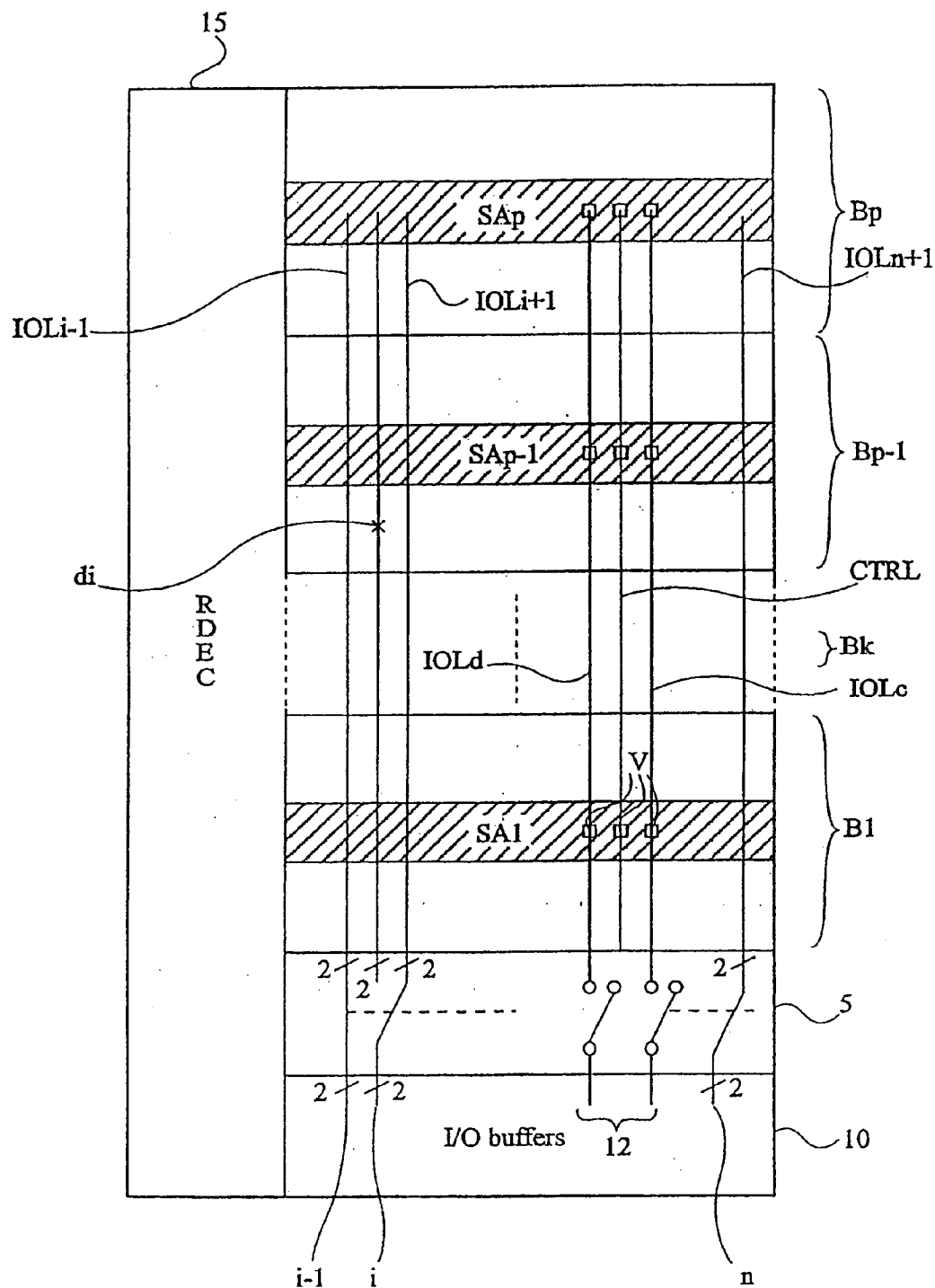
FIG. 1, previously described, shows a conventional example of an integrated circuit memory architecture.

The same elements have been designated with the same references in the different drawings. For clarity, only those elements which are necessary to the understanding of the present invention have been shown in the drawings and will be described hereafter. In particular, the details constitutive of the memory banks, of the sense amplifiers, of the input/output buffers, and of the decoding and addressing circuits have not been detailed.

A feature of the present invention is to place, at the level of each memory bank, that is, at the level of each cell array associated with a sense amplifier row, a circuit for reorganizing or reassigning the columns. This circuit enables individualizing, at the level of each memory bank, the use of the redundancy column(s).

Figure 2:
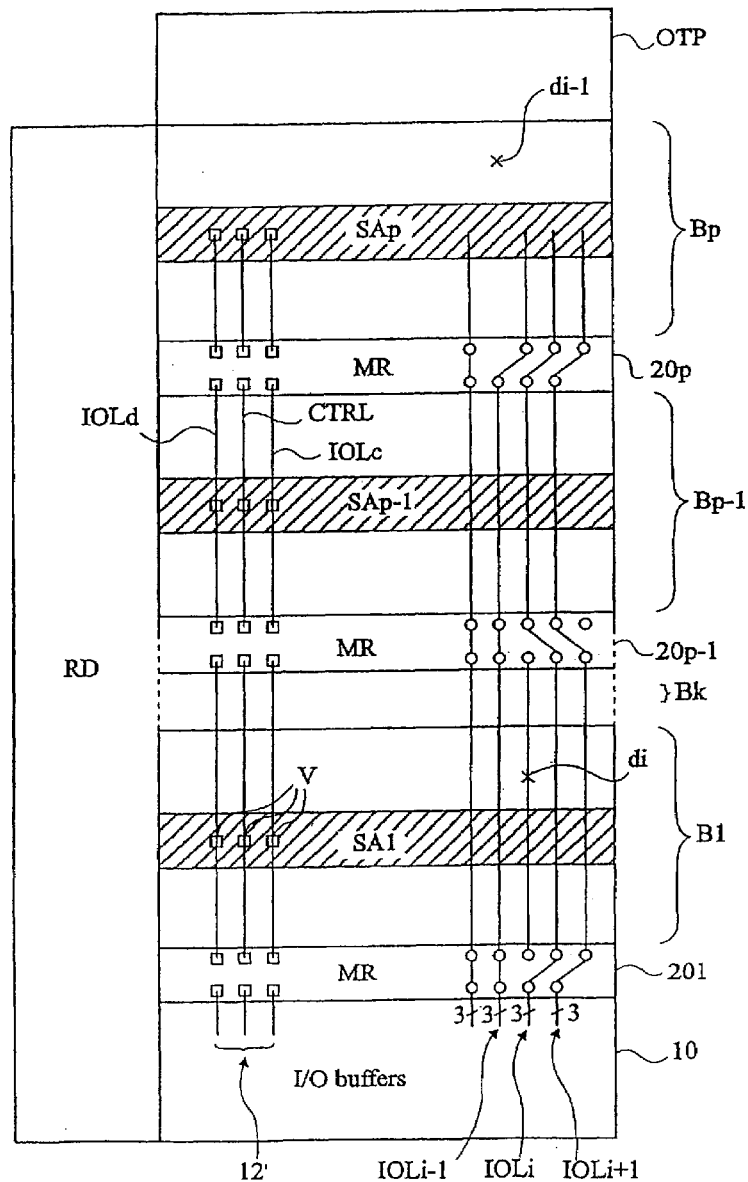
FIG. 2 shows, in a very simplified top view, an embodiment of an integrated circuit memory architecture according to the present invention.
Figure 2A:
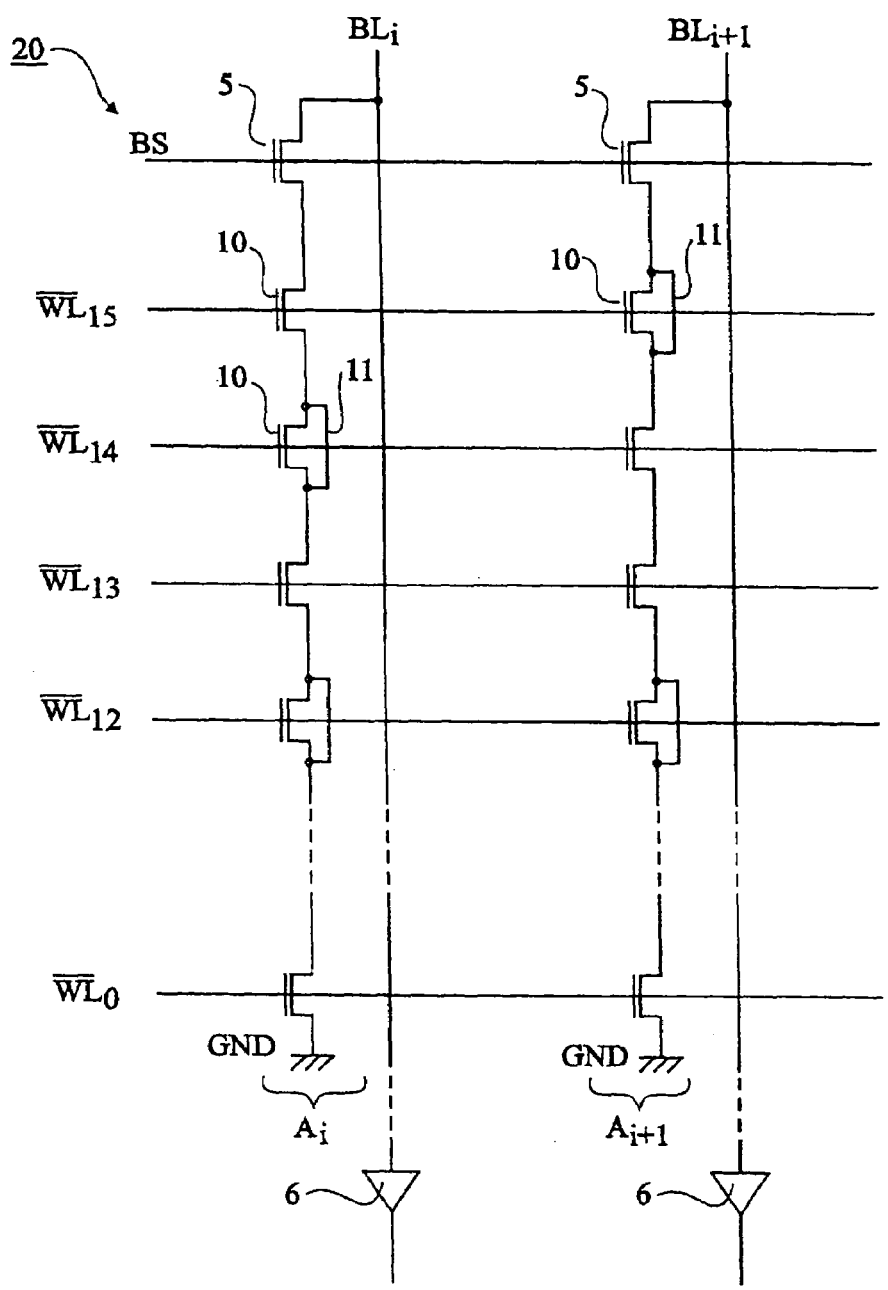
Figure 2B:
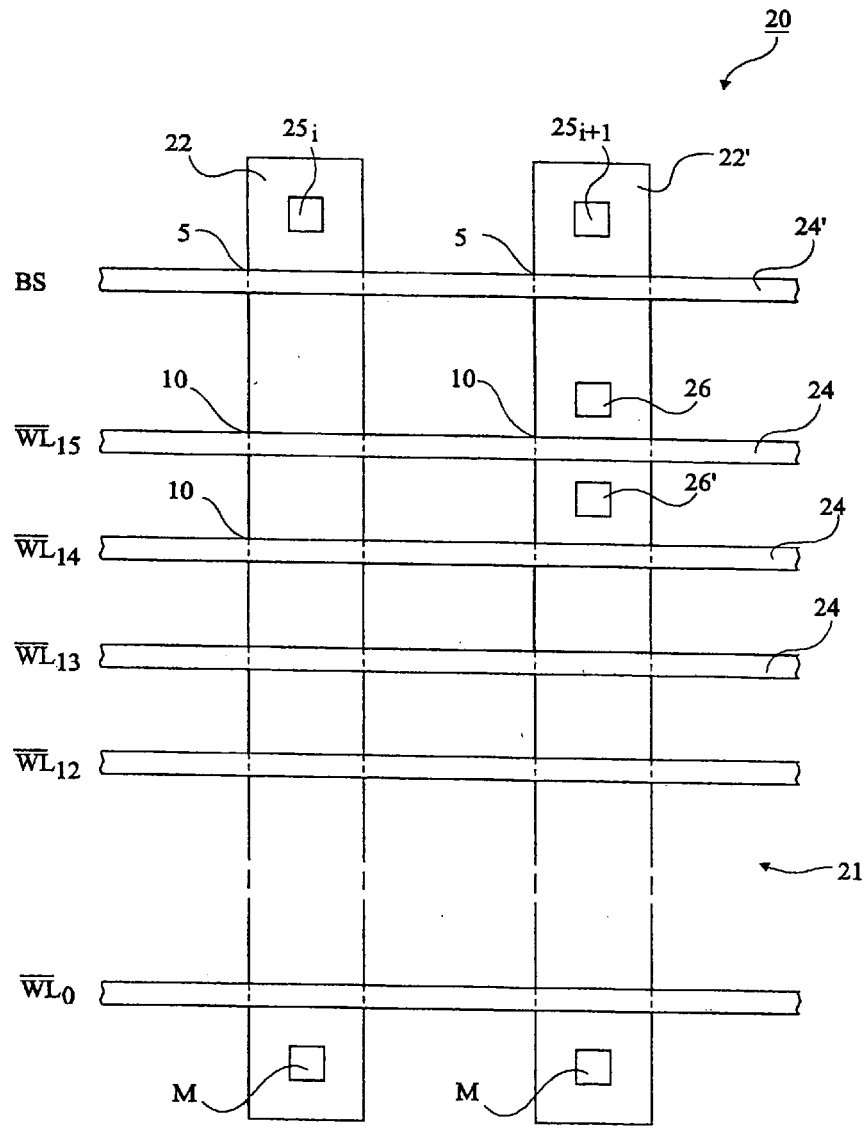

FIG. 2 shows, in a very simplified top view to be compared with that of FIG. 1, an embodiment of a memory circuit architecture according to the present invention.

As previously, several banks $B_j$, $B_k$, $B_{p-1}$, $B_p$ each including an array of memory cells associated with a row $SA_j$, $SA_k$, $SA_{p-1}$, $SA_p$ of sense amplifiers, share a same row 10 of I/O buffers. In a memory of the present invention, the arrays of cells and the sense amplifiers respect the structure of a conventional memory. In particular, the bit lines (not shown) are gathered per array of memory cells $B_k$ at the level of each sense amplifier row. Similarly, as illustrated in the left-hand portion of FIG. 2 detailing a columns 12', the outputs of the sense amplifiers are brought back, by vias v, to the metallization level where direct and complementary conductors IOLd and IOLc of each input/output line, and conductors CTRL of activation of the individual supply of the amplifiers of each column, are formed.

According to the present invention, the input/output lines are, however, not continuous over all the memory banks, but are interrupted at the level of circuits $20_j$, $20_k$, $20_{p-1}$, $20_p$ of memory reorganization or of assignment of the redundancy column(s). Each circuit 20 is functionally formed of switches in a row by a number n+1 equal to the total number of memory cells (including the redundancy columns). A reorganization circuit is assigned to each memory bank. It is used to branch, for a given memory bank (rank k), an input/output line (column) coming from the bank of lower rank k−1 (in a row), either towards the column of rank i, or to the column of lower rank i−1, or to the column of greater rank i+1. The foregoing assumes the existence of a single redundancy column. If several redundancy columns are provided, the shifting possibilities are to be adapted to the number of these columns.

Figure 3:
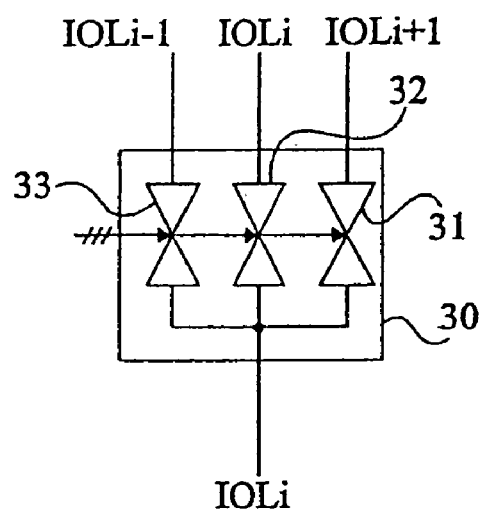
FIG. 3 shows a detail of a circuit for reorganizing memory banks according to the present invention.
Figure 4:
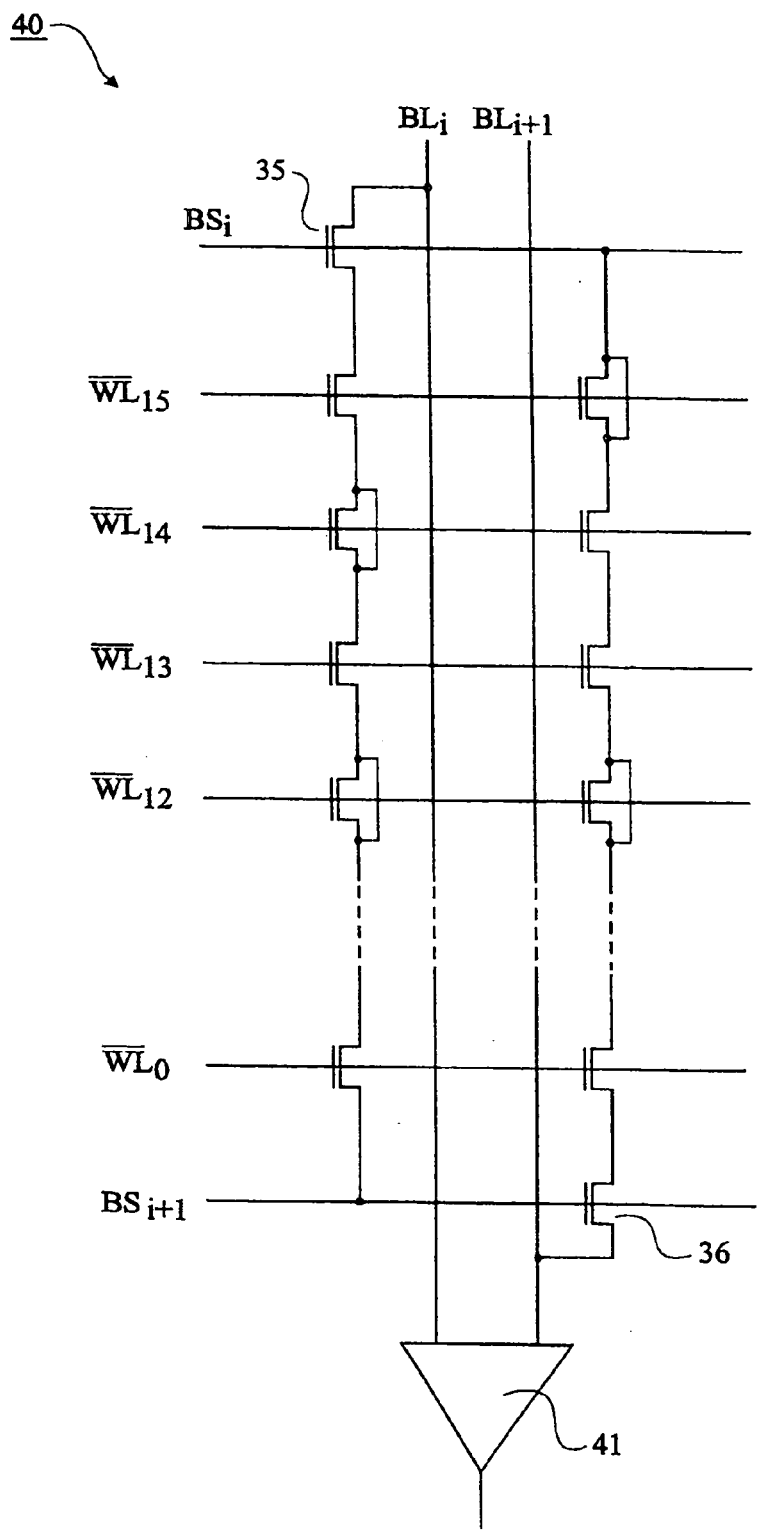

FIG. 3 shows a more detailed embodiment of a switch 30 of a reorganization circuit 20 according to the present invention. Switch 30 is found, in each reorganization circuit 20, for each input/output conductor column (IOL) and, although this has not been detailed, for each amplifier activation conductor. Assume an input/output line $IOL_i$ coming from a memory bank of rank k−1, switch 30 of circuit $20_k$ includes three switching elements 31, 32, and 33. A first terminal common to elements 31, 32, and 33 is connected to the end of the conductors of line $IOL_i$ coming from bank k−1. The second respective terminals of switches 31, 32, and 33 are individually connected to the conductors of input/output lines $IOL_{i+1}$, $IOL_i$, $IOL_{i-1}$ of bank k of memory cells associated with the involved reorganization circuit. Thus, the redundancy column can be assigned to each memory bank, that is, the memory cell column from which the shifting with branching of the electric signals of a current column to the following column can be chosen. According to the present invention, the branching can also be performed towards the preceding column, for example, in the case of a memory cell bank with no defects.

In FIG. 2, the patterns of the input/output lines in the corresponding metallization level have been shown to the left. These lines are interrupted at the level of each reorganization circuit 20 to enable their reassigning at the level of each memory cell bank. In each memory cell bank, the vias v connect the involved sense amplifiers to input/output lines IOL and to the sense amplifier supply control line. For each memory cell column, three conductors of the metallization level of the input/output lines are thus used. Two conductors are used for the actual (direct and complementary) input/output conductors. A third conductor is used for the supply control signal of the sense amplifier of the involved column.

Thus, another feature of the present invention is that the sense amplifier supply control conductors are also reorganized by circuits 20. In a conventional circuit, the row of switches (5, FIG. 1) for organizing the redundancy is not concerned by the branching of the sense amplifier supply control circuits. Indeed, this circuit only disables the supply of the amplifiers of the defective column and branches, to the columns of higher rank, the input/output lines.

To the right of FIG. 2, an example of a redundancy organization by means of a memory according to the present invention has been shown. To simplify, multiple-wire lines have been shown in the right-hand portion of FIG. 2. The existence of a defect $d_i$ in a memory cell of bank B1 is assumed. Reorganization circuit $20_1$ assigned to the first memory cell bank does not modify the branching of the input/output lines of the columns until column $IOL_{i-1}$. The input/output buffer of rank i is however assigned to column $IOL_{i+1}$ of bank 1. The buffer of rank i+1 is assigned to line $IOL_{i+2}$, and so on. This situation is assumed to be maintained until memory cell bank $B_{p-1}$ is reached, or, at least, that bank $B_{p-2}$ has the same structure as bank B1, that is, has a defect in its column of rank i. It is also assumed that bank $B_{p-1}$ has no defects. In this case, the lines of rank 1 to i−1 coming from bank $B_{p-2}$ are branched towards the input/output lines of same rank of bank $B_{p-2}$. The line of rank i coming from bank $B_{p-2}$ is left in the air at the level of reorganization circuit $20p-1$. Line $IOL_{i+1}$ is branched again by circuit $20_{p-1}$ to line $IOL_i$ in bank $B_{p-1}$, and so on until the last rank corresponding to the redundancy column. Accordingly, in bank $B_{p-1}$, the shifting is performed towards the columns of lower rank, and the redundancy column is not used.

It is assumed that bank $B_p$ exhibits a defect $d_{i-1}$ in the column of rank i−1. Reorganization circuit $20_p$ then causes the branching to the columns of greater rank of input/output lines $IOL_i$, $IOL_{i+1}$, etc.

As appears from the foregoing description, two defects $d_i$ and $d_{i-1}$ located in different columns of different memory cell arrays may thus be corrected by means of a single redundancy column common to the entire memory circuit.

An advantage of the present invention is that the individualized reorganizing at the level of the memory cell arrays requires no additional metallization level. Indeed, the branching implemented by the present invention remains in the metallization level of the input/output lines and does not fall to the level of the bit lines, that is, of the sense amplifiers.

Another advantage of the present invention is that there can be no comparison between the surface area increase made necessary by the reorganization circuits and that which would be necessary to reproduce, at the level of each memory bank, the input/output buffers.

The implementation of the present invention requires for the memory reorganization circuits to be individually addressable to individualize the branching at the level of each of these circuits.

Accordingly, in the testing of a memory circuit according to the present invention, this testing is individualized per memory cell bank and not only the columns of the different defects, but also the banks in which they are located, are stored.

Implementing the actual redundancy can be performed by any conventional means. According to a first example, fuses will be used to definitively reorganize this redundancy. According to a second example, registers programmed during the memory circuit testing, which will be read upon each powering-on of the memory to program the reorganization circuits, may be used. In this case, the coordinates of the defective memory cells are stored in a non-volatile memory. For example, the memory of FIG. 2 is associated with an array of one-time programming memory cells (OTP) in which the different coordinates are stored. A memory of SRAM type or a region of such a memory may also be used, provided that the system can ensure a permanent supply, at least on this circuit portion.

In the case of registers, the reorganizations are lost after each powering-off of the memory and reorganized after each powering-on. Such an embodiment can be combined with a dynamic use of the redundancy cells. An example of a dynamic redundancy memory circuit is described in U.S. Pat. No. 5, 982, 679, which is incorporated herein by reference.

Of course, the present invention is likely to have various alterations, modifications, and improvements which will readily occur to those skilled in the art. In particular, the number of redundancy columns may be adapted provided that the corresponding reorganization circuits enable a successive shifting of the input/output line columns on several neighboring columns.

Further, the practical implementation of the present invention, especially the programming of the memory control circuit to implement the redundancy function of the present invention, is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit memory comprising:
   a first memory bank having a first plurality of conductive lines associated with a first respective plurality of arrays of storage elements, and at least one first redundancy array;
   a second memory bank having a second plurality of conductive lines associated with a second respective plurality of arrays of storage elements, and at least one second redundancy array of storage elements;
   a row of input/output buffer circuits common to the memory banks;
   a plurality of input/output lines, each connected to one of the buffer circuits;
   a first assignment circuit that enables coupling of the first plurality of conductive lines respectively having rank i to the second plurality of conductive lines having respectively rank i−1, i or i+1;
   a second assignment circuit that enables coupling of the first plurality of conductive lines respectively having rank i to the plurality of input/output lines having respectively rank i−1, i or i+1.

2. The memory of claim 1, wherein said second assignment circuit is a switch for switching input/output lines formed in a same metallization level.

3. The memory of claim 2, further comprising sense amplifiers associated with each memory bank, wherein the input/output lines and conductors of activation of the sense amplifiers are formed in a same metallization level, said input/output lines and said conductors being interrupted at the level of the second assignment circuit.

4. The memory of claim 1, wherein the plurality of arrays of storage elements comprise columns of storage elements and the sense amplifiers are arranged in rows perpendicular to the columns.

5. The memory of claim 1, wherein the plurality of arrays of storage elements are arranged in columns, the redundancy elements comprise columns, and the number of sense amplifiers per memory bank corresponds to the total number of the arrays of storage elements, the number of input/output buffer circuits corresponding to the number of arrays of storage elements excluding the redundancy column.

6. The memory of claim 1, wherein the assignment circuits are programmed by means of non-volatile memory registers.

7. The memory of claim 1, including means for individually addressing each assignment circuit.

8. A memory circuit, comprising:
   a first memory bank having a first plurality of conductive lines associated with a first respective plurality of columns of memory cells and at least one first redundancy column of memory cells;
   a second memory bank having a second plurality of conductive lines associated with a second respective plurality of columns of memory cells and at least one second redundancy column of memory cells; and
   a first assignment circuit that enables coupling the first plurality of conductive lines respectively having rank i to the second plurality of conductive lines having respectively rank i−1, i or i+1.

9. The memory circuit of claim 8, further comprising:
   at least one input/output buffer circuit shared by the first memory bank and the second memory bank.

10. The memory circuit of claim 8, wherein the first memory bank is associated with a first plurality of sense amplifiers and the second memory bank is associated with a second plurality of sense amplifiers.

11. The memory circuit of claim 8, wherein the first assignment circuit comprises a set of switches.

12. The memory circuit of claim 11, wherein the set of switches couples the conductive lines formed in a same metallization level.

13. The memory circuit of claim 11, wherein the switches in the set of switches are individually coupled to one of the first plurality of conductive lines having rank i and three of the second plurality of conductive lines having rank i−1, i and i+1, respectively.

14. The memory circuit of claim 8, wherein the first assignment circuit enables coupling the at least one first redundancy column to one of the second plurality of conductive lines.

15. The memory circuit of claim 8, further comprising:
   a third memory bank having a third plurality of conductive lines associated with a third respective plurality of columns of memory cells and at least one third redundancy column of memory cells; and
   a second assignment circuit that enables coupling the second plurality of conductive lines respectively having rank i to the third plurality of conductive lines having respectively rank i−1, i or i+1.

16. The memory circuit of claim 8, wherein the first plurality of conductive lines and the second plurality conductive lines are portions of input/output lines.

17. The memory circuit of claim 8, wherein the first assignment circuit is programmed by at least one non-volatile memory register.

18. The memory circuit of claim 8, wherein each column in the first plurality of columns is aligned with each column in the second plurality of columns.

19. A memory circuit, comprising:
   a first memory bank having a first plurality of sense amplifiers and a first plurality of control lines that control activation of the first plurality of sense amplifiers;
   a second memory bank having a second plurality of sense amplifiers and a second plurality of control lines that control activation of the second plurality of sense amplifiers; and
   a first assignment circuit that couples the first plurality of control lines to the second plurality of control lines and enables switching an arrangement in which the first plurality of control lines is coupled to the second plurality of control lines;
   wherein the assignment circuit enables coupling the first plurality of control lines respectively having rank i to the second plurality of control lines having respectively rank i−1, i or i+1.

20. The memory circuit of claim 19, wherein the first assignment circuit comprises a set of switches.

21. The memory circuit of claim 19, wherein the first plurality of control lines and the second plurality of control lines are formed in a same metallization level as input/output lines that are shared by the first and second memory banks.

22. The memory circuit of claim 19, further comprising:
- a third memory bank having a third plurality of sense amplifiers and a third plurality of control lines that control activation of the third plurality of sense amplifiers; and
- a second assignment circuit that couples the second plurality of control lines to the third plurality of control lines and enables switching an arrangement in which the second plurality of control lines is coupled to the third plurality of control lines.

23. The memory circuit of claim 19, wherein the first assignment circuit is programmed by at least one non-volatile memory register.

24. The memory circuit of claim 19, further comprising:
- at least one input/output buffer circuit shared by the first memory bank and the second memory bank.

25. The memory circuit of claim 19, wherein the first memory bank further comprises a first plurality of conductive lines associated with a first respective plurality of columns of memory cells and at least one first redundancy column of memory cells;
- wherein the second memory bank further comprises a second plurality of conductive lines associated with a second respective plurality of columns of memory cells and at least one second redundancy column of memory cells;
- wherein the first assignment circuit enables coupling the first plurality of conductive lines respectively having rank i to the second plurality of conductive lines having respectively rank i−1, i or i+1.

* * * * *